United States Patent
Li et al.

(10) Patent No.: US 11,526,222 B2
(45) Date of Patent: Dec. 13, 2022

(54) FOLDABLE DISPLAY SCREEN AND ASSEMBLING METHOD THEREOF, AND DISPLAY APPARATUS

(71) Applicant: BOE TECHNOLOGY GROUP CO., LTD., Beijing (CN)

(72) Inventors: Zhao Li, Beijing (CN); Shiming Shi, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 30 days.

(21) Appl. No.: 16/959,362

(22) PCT Filed: Aug. 19, 2019

(86) PCT No.: PCT/CN2019/101417
§ 371 (c)(1),
(2) Date: Jun. 30, 2020

(87) PCT Pub. No.: WO2021/031081
PCT Pub. Date: Feb. 25, 2021

(65) Prior Publication Data
US 2021/0405781 A1    Dec. 30, 2021

(51) Int. Cl.
*G06F 3/041* (2006.01)
*H01L 27/32* (2006.01)
(Continued)

(52) U.S. Cl.
CPC ............... *G06F 3/041* (2013.01); *C09J 7/10* (2018.01); *H01L 27/323* (2013.01);
(Continued)

(58) Field of Classification Search
CPC .......... G06F 3/041; C09J 7/10; H01L 27/323; H01L 51/0097; H01L 51/5253; H01L 51/5281
See application file for complete search history.

(56) References Cited

U.S. PATENT DOCUMENTS 10,263,204 B2 * 4/2019 Shin .................... H01L 51/0097
10,268,238 B2 * 4/2019 Hamburgen .......... G06F 1/1626
(Continued)

FOREIGN PATENT DOCUMENTS

CN    106318241 A    1/2017
CN    108628486 A    10/2018
(Continued)

OTHER PUBLICATIONS

Extended European Search Report dated Jul. 20, 2022 received in European Patent Application No. EP 19942006.8.

*Primary Examiner* — Sardis F Azongha
(74) *Attorney, Agent, or Firm* — Scully Scott Murphy & Presser (57) ABSTRACT

A foldable display screen and an assembling method thereof, and a display apparatus are provided. The foldable display screen includes: a display panel; a touch sensing panel, located on a side of the display panel; a first optical adhesive layer, located on a side of the touch sensing panel away from the display panel; and a second optical adhesive layer, located between the display panel and the touch sensing panel; a thickness of the first optical adhesive layer and a thickness of the second optical adhesive layer are both 20 µm to 200 µm; and at a working temperature, an elastic modulus of the first optical adhesive layer and an elastic modulus of the second optical adhesive layer are both less than 1 Mpa.

19 Claims, 5 Drawing Sheets

(51) Int. Cl.
*H01L 51/00* (2006.01)
*H01L 51/52* (2006.01)
*C09J 7/10* (2018.01)

(52) U.S. Cl.
CPC ...... *H01L 51/0097* (2013.01); *H01L 51/5253* (2013.01); *H01L 51/5281* (2013.01); *C09J 2203/326* (2013.01); *C09J 2301/208* (2020.08); *G06F 2203/04102* (2013.01); *H01L 2251/5338* (2013.01)

(56) References Cited

U.S. PATENT DOCUMENTS

| | | | |
|---|---|---|---|
| 10,903,435 B2* | 1/2021 | Lee | B32B 7/12 |
| 11,119,597 B2 | 9/2021 | Yu et al. | |
| 2015/0200375 A1* | 7/2015 | Kim | H01L 27/3244 |
| | | | 257/40 |
| 2015/0266272 A1* | 9/2015 | Lee | B32B 17/10 |
| | | | 428/189 |
| 2017/0002237 A1 | 1/2017 | Cho et al. | |
| 2017/0147117 A1* | 5/2017 | Song | G06F 3/0443 |
| 2018/0287092 A1 | 10/2018 | Song et al. | |
| 2019/0115547 A1 | 4/2019 | Lee et al. | |

FOREIGN PATENT DOCUMENTS

| | | |
|---|---|---|
| CN | 208385410 U | 1/2019 |
| CN | 208753324 U | 4/2019 |
| CN | 110010013 A | 7/2019 |
| KR | 10-1983296 B1 | 5/2019 |
| KR | 20190088396 A | 7/2019 |

* cited by examiner

Thickness of first optical adhesive layer

FIG. 7

Thickness of first optical adhesive layer

FOLDABLE DISPLAY SCREEN AND ASSEMBLING METHOD THEREOF, AND DISPLAY APPARATUS

CROSS-REFERENCE TO RELATED APPLICATIONS

This application is a national phase entry of PCT International Application No. PCT/CN2019/101417, filed on Aug. 19, 2019. The disclosure of PCT International Application No. PCT/CN2019/101417 is incorporated by reference herein.

TECHNICAL FIELD

At least one embodiment of the present disclosure relates to a foldable display screen and an assembling method thereof, and a display apparatus.

BACKGROUND

A foldable display module includes functional film layers such as a cover, a Touch Sensing Panel (TSP), a Circular Polarizer sheet (CPOL) and a display panel. Stack design of the module is required to make respective film layers are all within a safe range during bending.

SUMMARY

At least one embodiment of the present disclosure provides a foldable display screen and an assembling method thereof, and a display apparatus.

In the first aspect, at least one embodiment of the present disclosure provides a foldable display screen, including: a display panel; a touch sensing panel, located on a side of the display panel; a first optical adhesive layer, located on a side of the touch sensing panel away from the display panel; and a second optical adhesive layer, located between the display panel and the touch sensing panel, wherein, a thickness of the first optical adhesive layer and a thickness of the second optical adhesive layer are both 20 μm to 200 μm, and at a working temperature, an elastic modulus of the first optical adhesive layer and an elastic modulus of the second optical adhesive layer are both less than 1 Mpa.

For example, at the working temperature, the elastic modulus of the first optical adhesive layer and the elastic modulus of the second optical adhesive layer are both greater than 10 Kpa.

For example, at the working temperature, the elastic modulus of the first optical adhesive layer and the elastic modulus of the second optical adhesive layer are both less than 200 Kpa.

For example, the working temperature is a temperature in a range of −30° C. to 60° C.

For example, the working temperature includes at least one of a first temperature, a second temperature, and a third temperature; the first temperature is less than the second temperature; the first temperature is greater than the third temperature; and at each of the first temperature, the second temperature and the third temperature, the elastic modulus of the first optical adhesive layer and the elastic modulus of the second optical adhesive layer are both less than 1 Mpa.

For example, the first temperature includes 20° C., the second temperature includes 60° C., and the third temperature includes −30° C.

For example, at the first temperature, the elastic modulus of the first optical adhesive layer and the elastic modulus of the second optical adhesive layer are both 30 Kpa to 50 Kpa; at the second temperature, the elastic modulus of the first optical adhesive layer and the elastic modulus of the second optical adhesive layer are both 10 Kpa to 30 Kpa; and at the third temperature, the elastic modulus of the first optical adhesive layer and the elastic modulus of the second optical adhesive layer are both 90 Kpa to 110 Kpa.

For example, at the first temperature, the elastic modulus of the first optical adhesive layer is 100 Kpa to 120 Kpa, and the elastic modulus of the second optical adhesive layer is 30 Kpa to 50 Kpa; at the second temperature, the elastic modulus of the first optical adhesive layer is 80 Kpa to 100 Kpa, and the elastic modulus of the second optical adhesive layer is 10 Kpa to 30 Kpa; at the third temperature, the elastic modulus of the first optical adhesive layer is 850 Kpa to 950 Kpa, and the elastic modulus of the second optical adhesive layer is 90 Kpa to 110 Kpa.

For example, the elastic modulus of the first optical adhesive layer is greater than or equal to the elastic modulus of the second optical adhesive layer, and the thickness of the first optical adhesive layer is less than or equal to the thickness of the second optical adhesive layer.

For example, the thickness of the first optical adhesive layer and the thickness of the second optical adhesive layer are both 20 μm to 200 μm.

For example, the thickness of the second optical adhesive layer is 1.5 to 3.5 times the thickness of the first optical adhesive layer.

For example, the thickness of the first optical adhesive layer is 40 μm to 60 μm, and the thickness of the second optical adhesive layer is 50 μm to 145 μm.

For example, the foldable display screen further includes a base film and an anti-reflection layer; wherein, the base film is located on a side of the display panel away from the second optical adhesive layer; and the anti-reflection layer is located between the display panel and the second optical adhesive layer.

For example, the anti-reflection layer includes a polarizer sheet.

For example, the foldable display screen further includes a cover layer; wherein, the cover layer is located on a side of the first optical adhesive layer away from the touch sensing panel.

For example, the foldable display screen has a first neutral layer and a second neutral layer, the first neutral layer is located in the display panel; and the second neutral layer is located in the touch sensing panel.

For example, the display panel comprises a first base substrate, and a light-emitting device layer and an encapsulation layer located on a side of the first base substrate closer to the second optical adhesive layer; the encapsulation layer is configured to encapsulate a light-emitting device in the light-emitting device layer; and the first neutral layer includes the encapsulation layer.

For example, the touch sensing panel includes a second base substrate and a touch structure located on the second base substrate; and the second neutral layer includes the touch structure.

For example, the foldable display screen includes a bendable region and a non-bendable region; the bendable region is configured to be bendable around a rotating shaft extending along a first direction; the non-bendable region is located on at least one side of the bendable region in a second direction; and the second direction is perpendicular to the first direction.

In the second aspect, at least one embodiment of the present disclosure provides a foldable display screen, including:

a display panel;

a touch sensing panel, located on one side of the display panel; a first optical adhesive layer, located on a side of the touch sensing panel away from the display panel; and a second optical adhesive layer, located between the display panel and the touch sensing panel; at a working temperature, a ratio of an elastic modulus of the first optical adhesive layer to a thickness of the first optical adhesive layer is a first ratio; a ratio of an elastic modulus of the second optical adhesive layer to a thickness of the second optical adhesive layer is a second ratio; and both the first ratio and the second ratio are less than 1/20 Mpa/μm.

In some of the embodiments of the present disclosure, the first ratio and the second ratio are positively correlated.

In some of the embodiments of the present disclosure, the first ratio is greater than the second ratio.

In some of the embodiments of the present disclosure, the first ratio and the second ratio are both greater than 0.01/200 Mpa/μm.

In some of the embodiments of the present disclosure, the first ratio is less than 1/40 Mpa/μm, and greater than 0.01/60 Mpa/μm.

In some of the embodiments of the present disclosure, the second ratio is less than 1/50 Mpa/μm, and greater than 0.01/145 Mpa/μm.

In some of the embodiments of the present disclosure, a thickness of the first optical adhesive layer and a thickness of the second optical adhesive layer are both 20 μm to 200 μm; at a working temperature, an elastic modulus of the first optical adhesive layer and an elastic modulus of the second optical adhesive layer are both less than 1 Mpa.

In some of the embodiments of the present disclosure, at the working temperature, the elastic modulus of the first optical adhesive layer and the elastic modulus of the second optical adhesive layer are both greater than 10 Kpa.

In some of the embodiments of the present disclosure, at the working temperature, the elastic modulus of the first optical adhesive layer and the elastic modulus of the second optical adhesive layer are both less than 200 Kpa.

In some of the embodiments of the present disclosure, the working temperature is a temperature in a range of −30° C. to 60° C.

In some of the embodiments of the present disclosure, the working temperature includes at least one of a first temperature, a second temperature, and a third temperature; the first temperature is less than the second temperature; the first temperature is greater than the third temperature; and at each of the first temperature, the second temperature and the third temperature, the elastic modulus of the first optical adhesive layer and the elastic modulus of the second optical adhesive layer are both less than 1 Mpa.

In some of the embodiments of the present disclosure, the first temperature includes 20° C., the second temperature includes 60° C., and the third temperature includes −30° C.

In some of the embodiments of the present disclosure, at the first temperature, the elastic modulus of the first optical adhesive layer and the elastic modulus of the second optical adhesive layer are both 30 Kpa to 50 Kpa; at the second temperature, the elastic modulus of the first optical adhesive layer and the elastic modulus of the second optical adhesive layer are both 10 Kpa to 30 Kpa; and at the third temperature, the elastic modulus of the first optical adhesive layer and the elastic modulus of the second optical adhesive layer are both 90 Kpa to 110 Kpa.

In some of the embodiments of the present disclosure, at the first temperature, the elastic modulus of the first optical adhesive layer and the elastic modulus of the second optical adhesive layer are both 100 Kpa to 120 Kpa; at the second temperature, the elastic modulus of the first optical adhesive layer and the elastic modulus of the second optical adhesive layer are both 80 Kpa to 100 Kpa; and at the third temperature, the elastic modulus of the first optical adhesive layer and the elastic modulus of the second optical adhesive layer are both 850 Kpa to 950 Kpa.

In some of the embodiments of the present disclosure, the elastic modulus of the first optical adhesive layer is greater than or equal to the elastic modulus of the second optical adhesive layer, and the thickness of the first optical adhesive layer is less than or equal to the thickness of the second optical adhesive layer.

In some of the embodiments of the present disclosure, the thickness of the second optical adhesive layer is 1.5 to 3.5 times the thickness of the first optical adhesive layer.

In some of the embodiments of the present disclosure, the thickness of the first optical adhesive layer is 40 μm to 60 μm, and the thickness of the second optical adhesive layer is 50 μm to 145 μm.

In some of the embodiments of the present disclosure, the foldable display screen further includes a base film and an anti-reflection layer; wherein, the base film is located on a side of the display panel away from the second optical adhesive layer; and the anti-reflection layer is located between the display panel and the second optical adhesive layer.

In some of the embodiments of the present disclosure, the foldable display screen further includes a cover layer; wherein, the cover layer is located on a side of the first optical adhesive layer away from the touch sensing panel.

In some of the embodiments of the present disclosure, the foldable display screen has a first neutral layer and a second neutral layer; the first neutral layer is located in the display panel; and the second neutral layer is located in the touch sensing panel; the display panel includes a first base substrate, as well as a light-emitting device layer and an encapsulation layer located on a side of the first base substrate closer to the second optical adhesive layer; the encapsulation layer is configured to encapsulate a light-emitting device in the light-emitting device layer; and the first neutral layer includes the encapsulation layer; the touch sensing panel includes a second base substrate and a touch structure located on the second base substrate; and the second neutral layer includes the touch structure.

In the fourth aspect, at least one embodiment of the present disclosure provides a display apparatus, including anyone of the above described foldable display screens.

In the fourth aspect, at least one embodiment of the present disclosure provides an assembling method of a foldable display screen, including: bonding a first anti-reflection layer and a first base film to both sides of a display panel motherboard respectively; bonding a touch sensing panel motherboard and a first cover layer through a first optical adhesive thin film; and bonding the first anti-reflection layer and the touch sensing panel motherboard through a second optical adhesive thin film, the second optical adhesive thin film and the first optical adhesive thin film being arranged on both sides of the touch sensing panel motherboard respectively.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those ordinarily skilled in the art can obtain other embodiment(s), without any inventive work, which should be within the scope of the present disclosure.

Unless otherwise specified, the technical terms or scientific terms used in the present disclosure should be of general meaning as understood by those ordinarily skilled in the art. In the disclosure, words such as "first", "second" and the like do not denote any order, quantity, or importance, but rather are used for distinguishing different components. Similarly, words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position of the described object is changed, the relative positional relationship may also be correspondingly changed.

Figure 1:
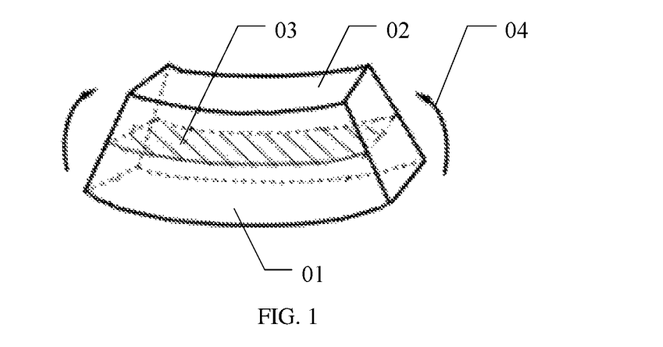
FIG. 1 is a schematic diagram of forces applied to a material during bending.

FIG. 1 is a schematic diagram of forces in bending a material. As shown in FIG. 1, during bending of the material, an outer layer 01 is stretched and an inner layer 02 is squeezed; on a cross section of the material, there must be a transition layer 03 that is neither subjected to tension nor subjected to pressure, that is, stress of the transition layer is almost equal to zero; and the transition layer 03 is referred to as a neutral layer 03 of the material. The length of the neutral layer 03 is unchanged during bending, so it will not be damaged by tension or pressure. It should be noted that, the "outer layer" and the "inner layer" as described above are sequentially arranged in a bending direction 04 of the material.

In a foldable display screen, selected position of the neutral layer can affect performance of the foldable display screen, and a proper position of the neutral layer is favorable for improving performance of the foldable display screen. The embodiments of the present disclosure implement position setting of the neutral layer by adjusting parameters of a first optical adhesive layer and a second optical adhesive layer. For example, the parameters include at least one of elastic modulus and thickness.

Figure 2:
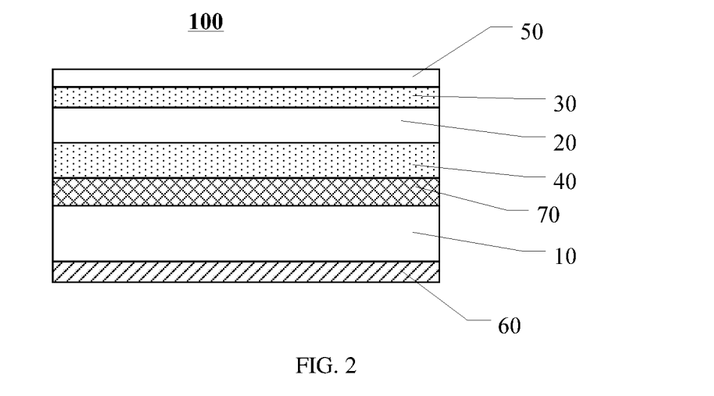
FIG. 2 is a structural schematic diagram of a foldable display screen provided by an embodiment of the present disclosure.

FIG. 2 is a structural schematic diagram of a foldable display screen provided by an embodiment of the present disclosure. As shown in FIG. 2, the foldable display screen 100 includes: a display panel 10, a touch sensing panel 20, a first optical adhesive layer 30 and a second optical adhesive layer 40. The touch sensing panel 20 is located on a side of the display panel 10. The first optical adhesive layer 30 is located on a side of the touch sensing panel 20 that is away from the display panel 10. The second optical adhesive layer 40 is located between the display panel 10 and the touch sensing panel 20. A thickness of the first optical adhesive layer 30 and a thickness of the second optical adhesive layer 40 are both 20 μm to 200 μm, and at a working temperature, an elastic modulus of the first optical adhesive layer 30 and an elastic modulus of the second optical adhesive layer 40 are both less than 1 Mpa.

The display panel 10 provides a display function. The touch sensing panel 20 is a touch screen and provides a touch function. For example, the display panel 10 is provided with film layers such as an inorganic layer and circuit wiring which are easily broken during bending; the touch sensing panel 20 is provided with film layers such as circuit wirings which are easily broken during bending; and the display panel 10 and the touch sensing panel 20 need to be protected at a same time by designing. The film layers easily broken during bending in the display panel 10 and the film layers easily broken during bending in the touch sensing panel 20 need to be protected at a same time. For example, the film layers easily broken during bending in the display panel 10 include an encapsulation layer, but are not limited thereto. For example, the film layers easily broken during bending in the touch sensing panel 20 include a touch structure, but are not limited thereto. The embodiments of the present disclosure are described by taking that the film layers easily broken during bending in the display panel 10 include an encapsulation layer, and the film layers easily broken during bending in the touch sensing panel 20 include a touch structure as an example.

In a conventional foldable display screen, at a working temperature, an elastic modulus of an optical adhesive layer adopted is usually several hundred megapascals. In the foldable display screen provided by the embodiment of the present disclosure, elastic moduli of the first optical adhesive layer 30 and the second optical adhesive layer 40 at working temperature are both less than 1 Mpa; and a smaller elastic modulus can be favorable for adjusting and setting a position of the neutral layer. In some embodiments, a foldable display screen can have two neutral layers formed, that is, a display panel 10 and a touch sensing panel 20 each have a neutral layer.

In addition to the above-described modes of limiting numerical values of the thickness of the first optical adhesive layer 30, the thickness of the second optical adhesive layer 40, the elastic modulus of the first optical adhesive layer 30 and the elastic modulus of the second optical adhesive layer 40, other modes can also be used, for example, limiting a ratio of the elastic modulus of the first optical adhesive layer to the thickness of the first optical adhesive layer, and a ratio of the elastic modulus of the second optical adhesive layer to the thickness of the second optical adhesive layer.

An embodiment of the present disclosure provides a foldable display screen; and as shown in FIG. 2, the foldable display screen 100 includes: a display panel 10, a touch sensing panel 20, a first optical adhesive layer 30, and a second optical adhesive layer 40. The touch sensing panel 20 is located on a side of the display panel 10. The first optical adhesive layer 30 is located on a side of the touch sensing panel 20 that is away from the display panel 10. The second optical adhesive layer 40 is located between the display panel 10 and the touch sensing panel 20. At a working temperature, a ratio of an elastic modulus of the first optical adhesive layer to a thickness of the first optical adhesive layer is a first ratio; a ratio of an elastic modulus of the second optical adhesive layer to a thickness of the second optical adhesive layer is a second ratio; and both the first ratio and the second ratio are less than $1/20$ Mpa/μm. In this case, neutral layers can be formed in the display panel 10 and the touch sensing panel 20 respectively to protect of the display panel 10 and the touch sensing panel 20.

In the embodiment of the present disclosure, the display panel 10 and the touch sensing panel 20 in the foldable display screen can be protected, no matter it satisfies conditions that the thickness of the first optical adhesive layer 30 and the thickness of the second optical adhesive layer 40 are both 20 μm to 200 μm, and the elastic modulus of the first optical adhesive layer 30 and the elastic modulus of the second optical adhesive layer 40 at the working temperature are both less than 1 Mpa, or it satisfies conditions that, at the working temperature, the ratio of the elastic modulus of the first optical adhesive layer to the thickness of the first optical adhesive layer is less than $1/20$ Mpa/μm, and the ratio of the elastic modulus of the second optical adhesive layer to the thickness of the second optical adhesive layer is less than $1/20$ Mpa/μm.

For example, the first ratio and the second ratio are both greater than $0.01/200$ Mpa/μm. When the first ratio and the second ratio are both less than $1/20$ Mpa/μm, and both greater than $0.01/200$ Mpa/μm, it can be favorable for protecting the display panel 10 and the touch sensing panel 20 in the foldable display screen. For example, in this case, the thickness of the first optical adhesive layer and the thickness of the second optical adhesive layer are both 20 μm to 200 μm; and at the working temperature, the elastic modulus of the first optical adhesive layer and the elastic modulus of the second optical adhesive layer are both less than 1 Mpa.

For example, the first ratio is less than $1/40$ Mpa/μm, and greater than $0.01/60$ Mpa/μm. In this case, at the working temperature, the elastic modulus of the first optical adhesive layer 30 is less than 1 Mpa and greater than 10 Kpa, and the thickness of the optical adhesive layer 30 is 40 μm to 60 μm.

For example, the second ratio is less than $1/50$ Mpa/μm, and greater than $0.01/145$ Mpa/μm. In this case, the thickness of the second optical adhesive layer 40 is 50 μm to 145 μm, and at the working temperature, the elastic modulus of the second optical adhesive layer 40 is less than 1 Mpa and greater than 10 Kpa.

Further, for example, the second ratio is less than $1/105$ Mpa/μm and greater than $0.01/145$ Mpa/μm. In this case, the thickness of the second optical adhesive layer 40 is 105 μm to 145 μm, and at the working temperature, the elastic modulus of the first optical adhesive layer 30 and the elastic modulus of the second optical adhesive layer 40 are both less than 1 Mpa and greater than 10 Kpa.

For example, when the first ratio and the second ratio are both less than $1/20$ Mpa/μm, the elastic modulus of the first optical adhesive layer 30 is less than 1 Mpa, and the elastic modulus of the second optical adhesive layer 40 is less than 1 Mpa.

For example, the first ratio and the second ratio are positively correlated, but are not limited thereto. For example, $R1=M1/H1$, $R2=M2/H2$, where, R1 is the first ratio, M1 is the elastic modulus of the first optical adhesive layer 30, H1 is the thickness of the first optical adhesive layer 30, R2 is the second ratio, M2 is the elastic modulus of the second optical adhesive layer 40, and H2 is the thickness of the second optical adhesive layer 40. For example, when adjusting R1 and R2 to obtain a foldable display screen with better folding performance, the first ratio can increase with increase of the second ratio, and the first ratio can decrease with decrease of the second ratio.

For example, in order to obtain a foldable display screen with better folding performance, the first ratio R1 is greater than the second ratio R2, but it is not limited thereto.

In the embodiment of the present disclosure, the mechanical parameters and the thicknesses of the first optical adhesive layer 30 and the second optical adhesive layer 40 are designed to protect the display panel 10 and the touch sensing panel 20 during bending.

In the embodiment of the present disclosure, the foldable display screen has two neutral layers; the display panel 10 and the touch sensing panel 20 each has a neutral layer; and the second optical adhesive layer 40 is configured to weaken influence of the display panel 10 on the neutral layer of the touch sensing panel 20; the first optical adhesive layer 30 is configured such that a film layer adhered thereto has certain influence on the neutral layer of the touch sensing panel 20, thereby making the neutral layer of the touch sensing panel 20 be located in the touch sensing panel 20 and allowing the touch sensing panel 20 to withstand pressure, so as not to be subjected to excessively large tension, thus protecting the touch sensing panel 20.

For example, the working temperature is a temperature in a range of −30° C. to 60° C. For example, the above-described working temperature is any temperature in the range of −30° C. to 60° C. Alternatively, the working temperature is a range, that is, at each temperature within the range of the working temperature, the elastic modulus of the first optical adhesive layer 30 and the elastic modulus of the second optical adhesive layer 40 are both less than 1 Mpa.

For example, the working temperature includes at least one of a first temperature, a second temperature, and a third temperature; the first temperature is less than the second temperature; the first temperature is greater than the third temperature; and at each of the first temperature, the second temperature and the third temperature, the elastic modulus of the first optical adhesive layer 30 and the elastic modulus of the second optical adhesive layer 40 are both less than 1 Mpa.

For example, the first temperature includes 20° C., the second temperature includes 60° C., and the third temperature includes −30° C. In the embodiment of the present disclosure, the first temperature is 20° C., the second temperature is 60° C., and the third temperature is −30° C. It should be noted that, the first temperature, the second temperature and the third temperature may also be other temperatures.

For example, an elastic modulus of the first optical adhesive layer 30 at the first temperature is greater than an elastic modulus of the first optical adhesive layer 30 at the second temperature, and is less than an elastic modulus of the first optical adhesive layer 30 at the third temperature; an elastic modulus of the second optical adhesive layer 40 at the first temperature is greater than an elastic modulus of the second optical adhesive layer 40 at the second temperature, and is less than an elastic modulus of the second optical adhesive layer 40 at the third temperature.

For example, in order to better adjust the neutral layer to a desired position, at the working temperature, the elastic modulus of the first optical adhesive layer 30 and the elastic modulus of the second optical adhesive layer 40 are both less than 200 Kpa, but are not limited thereto.

For example, in some embodiments, at a first temperature, an elastic modulus of a first optical adhesive layer 30 and an elastic modulus of a second optical adhesive layer 40 are both 30 Kpa to 50 Kpa; at a second temperature, the elastic modulus of the first optical adhesive layer 30 and the elastic modulus of the second optical adhesive layer 40 are both 10 Kpa to 30 Kpa; and at a third temperature, the elastic modulus of the first optical adhesive layer 30 and the elastic modulus of the second optical adhesive layer 40 are both 90 Kpa to 110 Kpa.

For example, in some embodiments, at a first temperature, an elastic modulus of a first optical adhesive layer 30 is 100 Kpa to 120 Kpa, and an elastic modulus of a second optical adhesive layer 40 is 30 Kpa to 50 Kpa; at a second temperature, the elastic modulus of the first optical adhesive layer 30 is 80 Kpa to 100 Kpa, and the elastic modulus of the second optical adhesive layer 40 is 10 Kpa to 30 Kpa; at a third temperature, the elastic modulus of the first optical adhesive layer 30 is 850 Kpa to 950 Kpa, and the elastic modulus of the second optical adhesive layer 40 is 90 Kpa to 110 Kpa.

For example, in some embodiments, an elastic modulus of a first optical adhesive layer 30 is equal to an elastic modulus of a second optical adhesive layer 40, but is not limited thereto. For example, in other embodiments, an elastic modulus of a first optical adhesive layer 30 is not equal to an elastic modulus of a second optical adhesive layer 40. For example, the elastic modulus of the first optical adhesive layer 30 is greater than the elastic modulus of the second optical adhesive layer 40.

For example, in order to weaken influence of the display panel 10 on the neutral layer of the touch sensing panel 20, the thickness of the second optical adhesive layer 40 can be made greater than the thickness of the first optical adhesive layer 30. For example, the thickness of the second optical adhesive layer 40 is 1.5 to 3.5 times the thickness of the first optical adhesive layer 30. Further, for example, the thickness of the second optical adhesive layer 40 is 1.75 to 3.5 times the thickness of the first optical adhesive layer 30. Of course, in order to weaken influence of the display panel 10 on the neutral layer of the touch sensing panel 20, the elastic modulus of the second optical adhesive layer 40 can also be adjusted.

For example, the thickness of the first optical adhesive layer 30 is less than or equal to the thickness of the second optical adhesive layer 40, but is not limited thereto. In other embodiments, a thickness of a first optical adhesive layer 30 can also be greater than a thickness of a second optical adhesive layer 40.

In some embodiments, a thickness of a first optical adhesive layer 30 and a thickness of a second optical adhesive layer 40 are both 20 μm to 200 μm. For example, the thickness of the first optical adhesive layer 30 is 40 μm to 60 μm, and the thickness of the second optical adhesive layer 40 is 50 μm to 145 μm. Further, for example, the thickness of the first optical adhesive layer 30 is 40 μm to 60 μm, and the thickness of the second optical adhesive layer 40 is 105 μm to 145 μm.

For example, an orthogonal projection of the first optical adhesive layer 30 on the display panel 10 and an orthogonal projection of the second optical adhesive layer 40 on the display panel 10 coincide with each other.

As shown in FIG. 2, the foldable display screen may further include a cover layer 50; and the cover layer 50 is located on a side of the first optical adhesive layer 30 that is away from the touch sensing panel 20. The first optical adhesive layer 30 makes the cover layer 50 be bonded onto the touch sensing panel 20, so that the cover layer 50 has certain influence on the neutral layer of the touch sensing panel 20, making the neutral layer of the touch sensing panel 20 move in a direction away from the display panel 10, so that the touch sensing panel 20 is not subjected to excessively large tension during bending, thus protecting the touch sensing panel 20.

As shown in FIG. 2, the foldable display screen can further include a base film 60 and an anti-reflection layer 70; the base film 60 is located on a side of the display panel 10 that is away from the second optical adhesive layer 40; and the anti-reflection layer 70 is located between the display panel 10 and the second optical adhesive layer 40. The anti-reflection layer 70 is used for anti-reflection of the display panel and provides protection for the display panel 10. For example, the anti-reflection layer 70 includes a circular polarizer sheet. For example, the anti-reflection layer 70 may include a linear polarizer sheet and a ¼ wave plate.

Of course, in other embodiments, a thickness of a second optical adhesive layer 40 can also be equal to a thickness of a first optical adhesive layer 30.

In the embodiment of the present disclosure, by designing the thicknesses of the first optical adhesive layer 30 and the second optical adhesive layer 40, the display panel 10 and the touch sensing panel 20 can be protected during bending.

Figure 3:
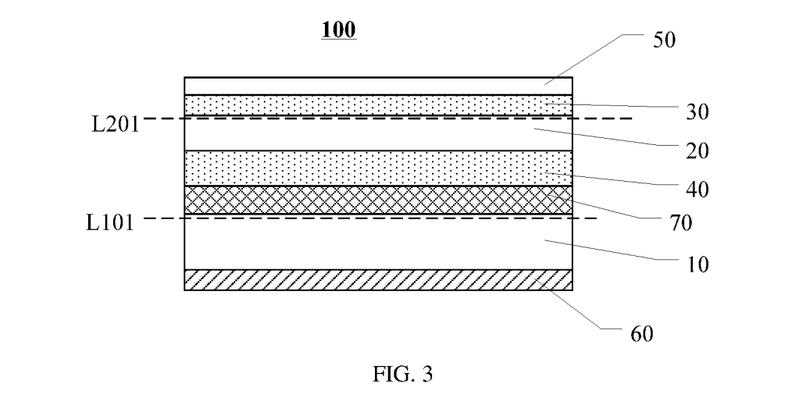
FIG. 3 is a schematic diagram of a neutral layer of a foldable display screen provided by an embodiment of the present disclosure.

FIG. 3 is a schematic diagram of a neutral layer of a foldable display screen provided by an embodiment of the present disclosure. The foldable display screen shown in FIG. 3 can be the foldable display screen 100 shown in FIG. 2. As shown in FIG. 3, the foldable display screen 100 has a first neutral layer L101 and a second neutral layer L201; the first neutral layer L101 is located in the display panel 10; and the second neutral layer L201 is located in the touch sensing panel 20.

Figure 4:
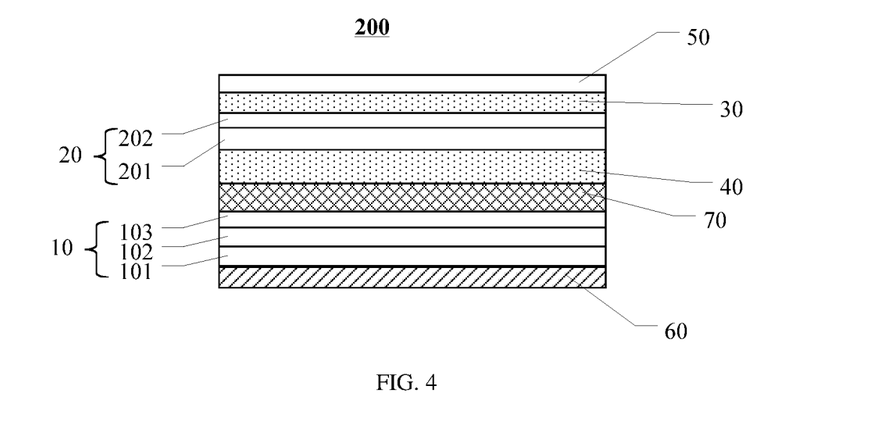
FIG. 4 is a structural schematic diagram of a foldable display screen provided by an embodiment of the present disclosure.

FIG. 4 is a structural schematic diagram of a foldable display screen provided by an embodiment of the present disclosure. As compared with the foldable display screen shown in FIG. 3, the foldable display screen 200 shown in FIG. 4 illustrates a structure of a display panel 10 and a structure of a touch sensing panel 20. The description of the foldable display screen shown in FIG. 3 can be referred to for remaining structures.

As shown in FIG. 4, the display panel 10 includes a first base substrate 101, as well as a light-emitting device layer 102 and an encapsulation layer 103 located on a side of the first base substrate 101 that is closer to the second optical adhesive layer 40; the light-emitting device layer 102 is more closer to the first base substrate 101 than the encapsulation layer 103; and a first neutral layer includes the encapsulation layer 103. For example, the encapsulation layer 103 includes a Thin Film Encapsulation (TFE) layer, but is not limited thereto. For example, the light-emitting device layer 102 includes a plurality of light-emitting devices arranged independently of each other, and the light-emitting device can include an Organic Light Emitting Diode (OLED), but is not limited thereto. The encapsulation layer 103 is configured to encapsulate the light-emitting devices in the light-emitting device layer 102. For example, the encapsulation layer 103 includes at least one organic layer and at least two inorganic layers; the inorganic layers are provided on a side of the organic layer that is closer to the base substrate and a side away from the base substrate respectively. For example, the encapsulation layer 103 includes a plurality of organic layers and a plurality of inorganic layers stacked and alternately arranged. For example, in a direction from a side closer to the base substrate to a side away from the base substrate, a first inorganic encapsulation layer, a first organic encapsulation layer, a second inorganic encapsulation layer, a second organic encapsulation layer, a third inorganic encapsulation layer, and a third organic encapsulation layer are sequentially arranged, but are not limited thereto. In order to protect the inorganic layer in the encapsulation layer 103 and prevent the inorganic layer from cracking during bending, the neutral layer in the display panel 10 can be made to include the encapsulation layer 103.

As shown in FIG. 4, the touch sensing panel 20 includes a second base substrate 201 and a touch structure 202 located on the second base substrate 201; and the second neutral layer includes the touch structure 202. The touch structure 202 includes, for example, a plurality of touch electrodes independent of each other, but is not limited thereto. In some embodiments, a touch structure 202 can further include a first electrode layer and a second electrode layer insulated from each other; an insulating layer may be provided between the first electrode layer and the second electrode layer; the first electrode layer can include a plurality of first touch electrodes parallel to each other; and the second electrode layer may include a plurality of second touch electrodes parallel to each other. The plurality of first touch electrodes can be perpendicular to the plurality of second touch electrodes. In other embodiments, a touch structure 202 can further include a first electrode layer and a second electrode layer insulated from each other; the first electrode layer and the second electrode layer are respectively arranged on both sides of the second base substrate 201; the first electrode layer may include a plurality of first touch electrodes parallel to each other; and the second electrode layer may include a plurality of second touch electrodes parallel to each other. The plurality of first touch electrodes can be perpendicular to the plurality of second touch electrodes. As shown in FIG. 4, the touch structure 202 is located on a side of the second base substrate 201 that is away from the display panel 10, which is taken as an example for describing the embodiments of the present disclosure.

Figure 5:
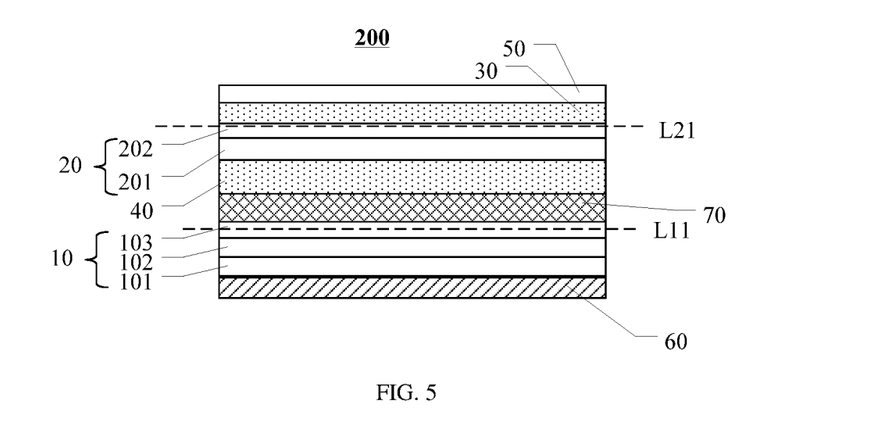
FIG. 5 is a schematic diagram of a neutral layer of a foldable display screen provided by an embodiment of the present disclosure.

FIG. 5 is a schematic diagram of neutral layers of a foldable display screen provided by an embodiment of the present disclosure. The foldable display screen shown in FIG. 5 can be the foldable display screen 200 shown in FIG. 4. As shown in FIG. 5, the foldable display screen 200 has a first neutral layer L11 and a second neutral layer L21; the first neutral layer L11 is located in a display panel 10; and the second neutral layer L21 is located in a touch sensing panel 20. Further, for example, the first neutral layer L11 includes an encapsulation layer 103; and the second neutral layer L21 includes a touch structure 202.

In the embodiment of the present disclosure, the display panel 10 and the touch sensing panel 20 are not limited to the structures shown in FIG. 4, and can be set as needed.

In some embodiments of the present disclosure, a first optical adhesive layer 30 and a second optical adhesive layer 40 can be Optical Clear Adhesive (OCA). For example, the first base substrate 101 and the second base substrate 201 can be flexible substrates, which are made of, for example, polyimide, but are not limited thereto. The base film 60 provides a protective effect; and the base film 60 can be made of a metal material, for example, stainless steel, and can be a patterned stainless steel film layer. The base film can be bonded onto the display panel by optical adhesive, which helps the display panel to restore flatness. The cover layer 50 is mainly used for protection, and has properties such as anti-fingerprint and scratch-resistance, etc. For example, the cover layer 50 includes a flexible polymer layer, but is not limited thereto. For example, materials of the first optical adhesive layer 30 and the second optical adhesive layer 40 can both include at least one of organic silicone, acrylic resin, polyurethane, and epoxy resin. The first optical adhesive layer 30 and the second optical adhesive layer 40 can be formed of a same material. Of course, the first optical adhesive layer 30 and the second optical adhesive layer 40 can also be formed of different materials.

Figure 6:
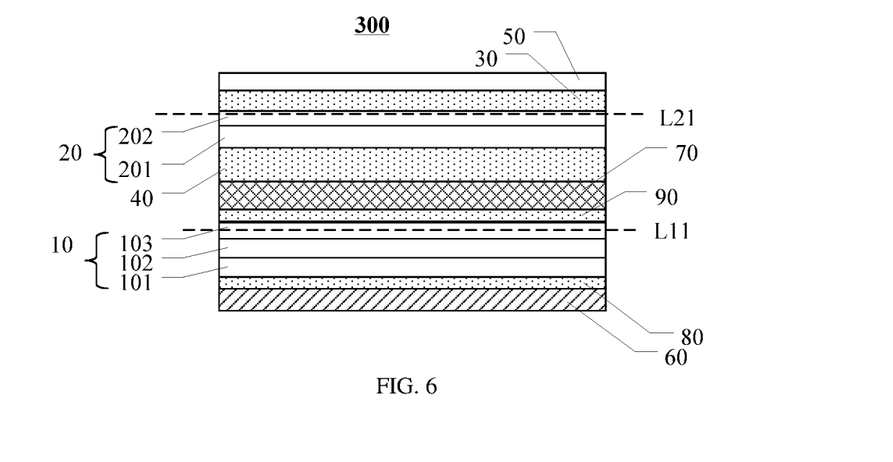
FIG. 6 is a schematic diagram of a foldable display screen provided by an embodiment of the present disclosure.

FIG. 6 is a schematic diagram of a foldable display screen provided by an embodiment of the present disclosure. As shown in FIG. 6, as compared with the foldable display screen 200 shown in FIG. 5, the foldable display screen 300 shown in FIG. 6 illustrates a third optical adhesive layer 80 and a fourth optical adhesive layer 90. A base film 60 is bonded onto a display panel 10 through the third optical adhesive layer 80, and an anti-reflection layer 70 is bonded onto the display panel 10 through the fourth optical adhesive layer 90.

As shown in FIG. 6 and FIG. 5, the base film 60 and the anti-reflection layer 70 are arranged symmetrically with respect to the display panel 10, which facilitates a first neutral layer of the display panel 10 to be located on a surface of an encapsulation layer, providing protection for the display panel 10, so that no new abnormality would appear during bending of the display panel 10.

For example, an elastic modulus of a first optical adhesive layer 30 is greater than or equal to an elastic modulus of a second optical adhesive layer 40, and a thickness of the first optical adhesive layer 30 is less than or equal to a thickness of the second optical adhesive layer 40.

For example, in one embodiment, at 20° C., an elastic modulus of a first optical adhesive layer 30 and an elastic modulus of a second optical adhesive layer 40 are both 30 Kpa to 50 Kpa; at 60° C., the elastic modulus of the first optical adhesive layer 30 and the elastic modulus of the second optical adhesive layer 40 are both 10 Kpa to 30 Kpa; at −30° C., the elastic modulus of the first optical adhesive layer 30 and the elastic modulus of the second optical adhesive layer 40 are both 90 Kpa to 110 Kpa. A thickness of the second optical adhesive layer 40 is 105 μm to 145 μm, and a thickness of the first optical adhesive layer 30 is 40 μm to 60 μm. The foldable display screen provided by this embodiment allows a neutral layer of the touch sensing panel 20 to be located at a touch structure, so that the touch structure is not subjected to excessively large tension during bending, thus protecting the touch sensing panel 20, and meanwhile allows the first neutral layer of the display panel 10 to be located at the surface of the encapsulation layer, providing protection for the display panel 10.

In this case, a first ratio and a second ratio can be calculated based on numerical values according to the above-described embodiments. For example, at 20° C., the first ratio of the first optical adhesive layer 30 is greater than 0.01/20 Mpa/μm and less than 0.01/8 Mpa/μm, and the second ratio of the second optical adhesive layer 40 is greater than 0.03/145 Mpa/μm and less than 0.01/21 Mpa/μm; at 60° C., the first ratio of the first optical adhesive layer 30 is greater than 0.01/60 Mpa/μm and less than 0.03/40 Mpa/μm, and the second ratio of the second optical adhesive layer 40 is greater than 0.01/145 Mpa/μm and less than 0.01/35 Mpa/μm; at −30° C., the first ratio of the first optical adhesive layer 30 is greater than 0.03/20 Mpa/μm and less than 0.11/40 Mpa/μm, and the second ratio of the second optical adhesive layer 40 is greater than 0.09/145 Mpa/μm and less than 0.11/105 Mpa/μm.

For example, the elastic modulus of the first optical adhesive layer 30 is greater than the elastic modulus of the second optical adhesive layer 40, and the thickness of the first optical adhesive layer 30 is less than or equal to the thickness of the second optical adhesive layer 40.

For example, in one embodiment, at a first temperature, an elastic modulus of a first optical adhesive layer 30 is 100 Kpa to 120 Kpa, and an elastic modulus of a second optical adhesive layer 40 is 30 Kpa to 50 Kpa; at a second temperature, the elastic modulus of the first optical adhesive layer 30 is 80 Kpa to 100 Kpa, and the elastic modulus of the second optical adhesive layer 40 is 10 Kpa to 30 Kpa; at a third temperature, the elastic modulus of the first optical adhesive layer 30 is 850 Kpa to 950 Kpa, and the elastic modulus of the second optical adhesive layer 40 is 90 Kpa to 110 Kpa. A thickness of the first optical adhesive layer 30 is 50 μm, and a thickness of the second optical adhesive layer 40 is 50 μm.

In this case, a first ratio and a second ratio can be calculated based on the numerical values according to the above-described embodiments. For example, at 20° C., the first ratio of the first optical adhesive layer 30 is greater than 0.1/50 Mpa/μm and less than 0.12/50 Mpa/μm, and the second ratio of the second optical adhesive layer 40 is greater than 0.03/50 Mpa/μm and less than 0.01/10 Mpa/μm; at 60° C., the first ratio of the first optical adhesive layer 30 is greater than 0.04/25 Mpa/μm and less than 0.1/50 Mpa/μm, and the second ratio of the second optical adhesive layer 40 is greater than 0.01/50 Mpa/μm and less than 0.03/50 Mpa/μm; at −30° C., the first ratio of the first optical adhesive layer 30 is greater than 0.17/10 Mpa/μm and less than 0.19/10 Mpa/μm, and the second ratio of the second optical adhesive layer 40 is greater than 0.09/50 Mpa/μm and less than 0.11/50 Mpa/μm.

In the foldable display screen provided by the embodiment of the present disclosure, position setting of the two neutral layers is implemented by adjusting the elastic modulus and the thickness of the first optical adhesive layer and the elastic modulus and the thickness of the second optical adhesive layer. The foldable display screen includes two neutral layers to protect the display panel 10 and the touch sensing panel 20 at a same time. Within the above-described given numerical range, the smaller the thickness of the first optical adhesive layer 30, the more favorable for adjusting the position of the neutral layer of the touch sensing panel 20 to a position closer to the cover layer, for example, to a position where the touch structure is located; the larger the thickness of the second optical adhesive layer 40 is, the more favorable for reducing influence of the display panel 10 on the neutral layer of the touch sensing panel 20. Within the above-described given numerical range, the greater the elastic modulus of the first optical adhesive layer 30, the more favorable for adjusting the position of the neutral layer of the touch sensing panel 20 to the position closer to the cover layer, for example, to the position where the touch structure is located; the less the elastic modulus of the second optical adhesive layer 40, the more favorable for reducing influence of the display panel 10 on the neutral layer of the touch sensing panel 20.

Figure 7:
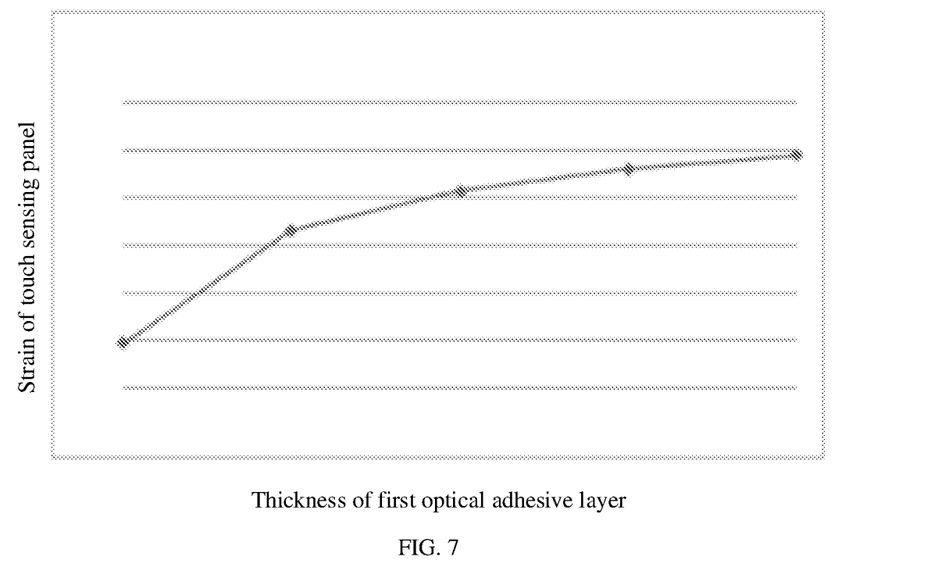
FIG. 7 is a diagram of relationship between strain of a touch sensing panel and a thickness of a first optical adhesive layer.
Figure 8:
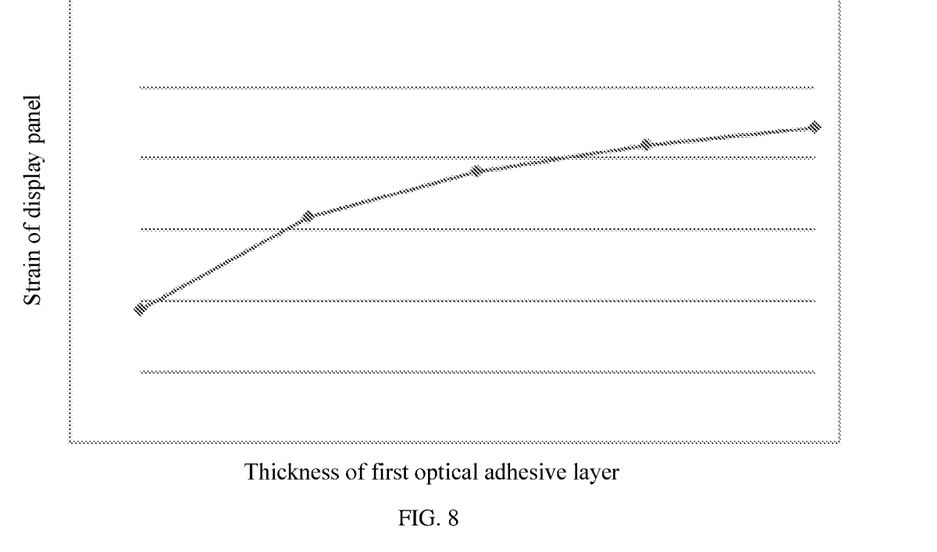
FIG. 8 is a diagram of relationship between strain of a display panel and the thickness of the first optical adhesive layer.

FIG. 7 is a diagram of relationship between strain of the touch sensing panel and the thickness of the first optical adhesive layer. The strain of the touch sensing panel shown in FIG. 7 is the strain of the touch structure in the touch sensing panel. When drawing the diagram of relationship shown in FIG. 7, the thickness of the first optical adhesive layer is changed, while the remaining parameters such as the elastic modulus of the first optical adhesive layer, the elastic modulus of the second optical adhesive layer, and the thickness of the second optical adhesive layer all remain unchanged. As shown in FIG. 7, as the thickness of the first optical adhesive layer increases, the strain of the touch structure gradually increases. For example, FIG. 7 is a graph drawn according to the corresponding strain of the touch sensing panel when the thickness of the first optical adhesive layer is 25 μm to 125 μm. FIG. 8 is a diagram of relationship between strain of the display panel and the thickness of the first optical adhesive layer. The strain of the display panel shown in FIG. 8 is the strain of a light-emitting functional layer and a semiconductor active layer in the display panel; and the semiconductor active layer is, for example, a polysilicon layer. For example, the semiconductor active layer is located in a thin film transistor. The thin film transistor can be located between the first base substrate and the light-emitting device layer. When drawing the diagram of relationship shown in FIG. 8, the thickness of the first optical adhesive layer is changed, while the remaining parameters such as the elastic modulus of the first optical adhesive layer, the elastic modulus of the second optical adhesive layer, and the thickness of the second optical adhesive layer all remain unchanged. As shown in FIG. 8, as the thickness of the first optical adhesive layer increases, the strain of the light-emitting functional layer and the semiconductor active layer gradually increases. For example, FIG. 8 is a graph drawn according to the corresponding strain of the display panel when the thickness of the first optical adhesive layer is 25 μm to 125 μm.

Figure 9:
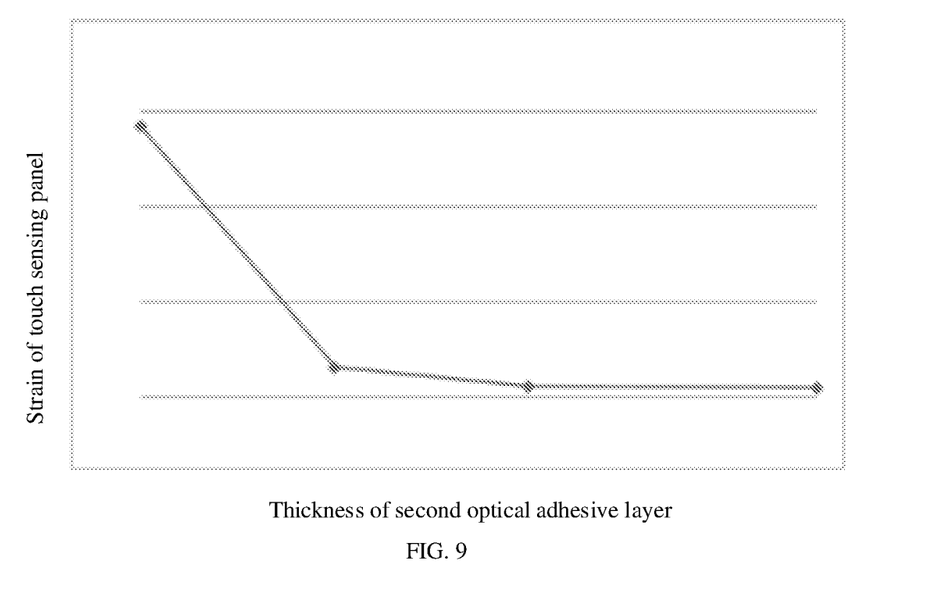
FIG. 9 is a diagram of relationship between strain of the touch sensing panel and a thickness of a second optical adhesive layer.

FIG. 9 is a diagram of relationship between the strain of the touch sensing panel and the thickness of the second optical adhesive layer. The strain of the touch sensing panel shown in FIG. 9 is the strain of the touch structure in the touch sensing panel. When drawing the diagram of relationship shown in FIG. 9, the thickness of the second optical adhesive layer is changed, while the remaining parameters such as the elastic modulus of the second optical adhesive layer, the elastic modulus of the first optical adhesive layer, and the thickness of the first optical adhesive layer all remain unchanged. As shown in FIG. 9, as the thickness of the second optical adhesive layer increases, the strain of the touch structure gradually decreases. For example, FIG. 9 is a graph drawn according to the corresponding strain of the touch sensing panel when the thickness of the second optical adhesive layer is 15 µm to 50 µm.

Figure 10:
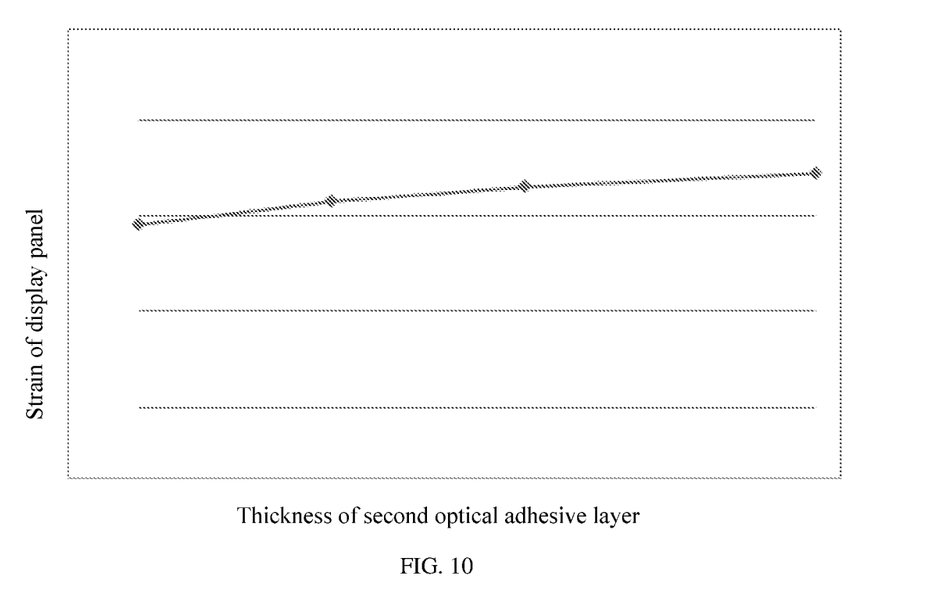
FIG. 10 is a diagram of relationship between strain of the display panel and the thickness of the second optical adhesive layer.

FIG. 10 is a diagram of relationship between the strain of the display panel and the thickness of the first optical adhesive layer. The strain of the display panel shown in FIG. 10 is the strain of the light-emitting functional layer and the semiconductor active layer in the display panel; and the active layer is, for example, a polysilicon layer. When drawing the diagram of relationship shown in FIG. 10, the thickness of the second optical adhesive layer is changed, while the remaining parameters such as the elastic modulus of the second optical adhesive layer, the elastic modulus of the first optical adhesive layer, and the thickness of the first optical adhesive layer all remain unchanged. As shown in FIG. 10, as the thickness of the second optical adhesive layer increases, the strain of the light-emitting functional layer and the semiconductor active layer gradually increases. For example, FIG. 10 is a graph drawn according to the corresponding strain of the display panel when the thickness of the second optical adhesive layer is 15 µm to 50 µm.

Figure 11:
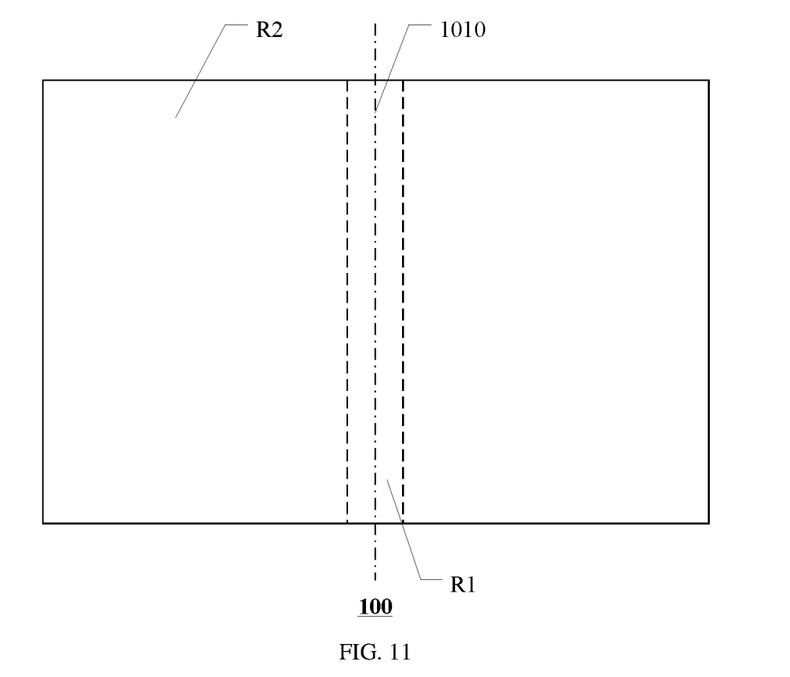
FIG. 11 is a planar schematic diagram of a foldable display screen provided by an embodiment of the present disclosure.

FIG. 11 is a planar schematic diagram of a foldable display screen provided by an embodiment of the present disclosure. As shown in FIG. 11, the foldable display screen 100 includes a bendable region R1 and a non-bendable region R2; the bendable region R1 is configured to be bendable around a rotating shaft 1010 extending along a first direction; the non-bendable region R2 is located on at least one side of the bendable region R1 in a second direction; and the second direction is perpendicular to the first direction. In other words, the bendable region R1 of the foldable display screen 100 can be bent, and the non-bendable region R2 of the foldable display screen 100 may not be bent, thereby improving flatness of the foldable display screen.

For example, as shown in FIG. 11, the non-bendable region R2 is located on both sides of the bendable region R1 in the second direction.

In some embodiments, as shown in FIG. 11, a size of a bendable region R1 in a first direction is the same as a size of a non-bendable region R2 in a first direction.

In some embodiments, the foldable display screen provided by the embodiments of the present disclosure may implement bending performance with an outer bending radius R5 and an inner bending radius R3.

In some embodiments, as shown in FIG. 11, when the foldable display screen 100 provided by the embodiments of the present disclosure is externally bent, that is, in an outwardly bent state, any one of two non-bendable regions R2 and a portion of a bendable region R1 that is closer to the non-bendable region R2 can be used as an independent sub-display screen to display a picture. In this case, the foldable display screen 100 can display one picture on one side, or can also display two pictures on both sides at a same time. When the foldable display screen 100 provided by the embodiments of the present disclosure is in an unfolded state, the two non-bendable regions R2 and the bendable region R1 between the two non-bendable regions R2 can display a picture together, or can also display different pictures in a split screen display mode, and the embodiments of the present disclosure include but are not limited thereto.

For example, one of the above-described two pictures can be used as a main picture, and the other can be used as a virtual keyboard, so that user's manipulation experience can be improved.

For example, one of the above-described two pictures can be a picture output by one program, and the other can be a picture output by another program, so that multi-functional processing may be implemented.

Figure 12:
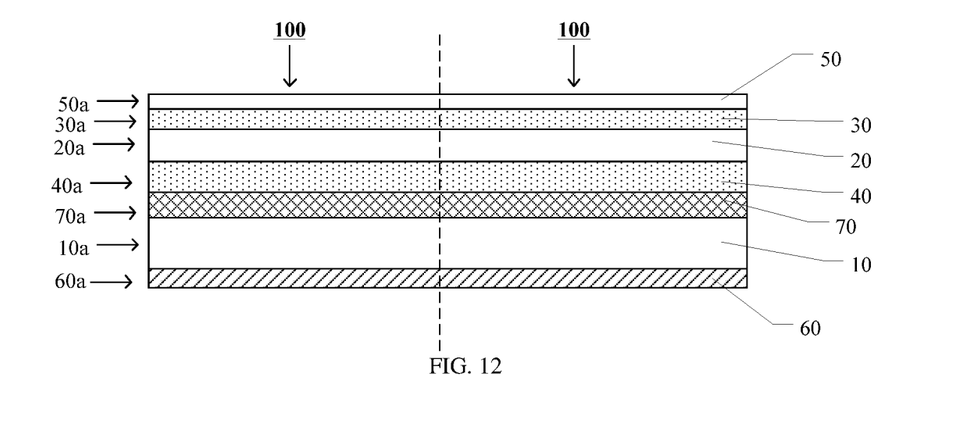
FIG. 12 is a schematic diagram of an assembling method of a foldable display screen provided by an embodiment of the present disclosure.

FIG. 12 is a schematic diagram of an assembling method of a foldable display screen provided by an embodiment of the present disclosure. The method includes: bonding a first anti-reflection layer 70*a* and a first base film 60*a* to both sides of a display panel motherboard 10*a* respectively; bonding a touch sensing panel motherboard 20*a* and a first cover layer 50*a* through a first optical adhesive thin film 30*a*; and bonding the first anti-reflection layer 70*a* and the touch sensing panel motherboard 20*a* through a second optical adhesive thin film 40*a*. The second optical adhesive thin film 40*a* and the first optical adhesive thin film 30*a* are arranged on both sides of the touch sensing panel motherboard 20*a* respectively.

For example, as shown in FIG. 12, the assembling method further includes form a plurality of foldable display screens by cutting. The dotted line in FIG. 12 is a cutting line, and two foldable display screens are formed after cutting. In the embodiment of the present disclosure, the number of single foldable display screens that can be formed from the display panel motherboard 10*a* will not be limited, and may be selected according to needs.

As shown in FIG. 12, the second optical adhesive thin film 40*a* can be correspondingly formed into a plurality of second optical adhesive layers 40; the first base film 60*a* can be correspondingly formed into a plurality of base films 60; the display panel motherboard 10*a* can be correspondingly formed into a plurality of display panels 10; the first anti-reflection layer 70*a* can be correspondingly formed into a plurality of anti-reflection layers 70; the touch sensing panel motherboard 20*a* can be correspondingly formed into a plurality of touch sensing panels 20; the first optical adhesive thin film 30*a* can be correspondingly formed into a plurality of first optical adhesive layers 30; and the first cover layer 50*a* can be correspondingly formed into a plurality of cover layers 50.

For example, in the embodiment of the present disclosure, the first optical film layer 30 and the second optical film layer 40 both have an entire surface covered, and the cover layer 50 cover the entire surface. For example, side edges of the first optical film layer 30 and the second optical film layer 40 are flush with each other.

At least one embodiment of the present disclosure provides a display apparatus, comprising any one of the above-described foldable display screens.

In some embodiments, the display apparatus may be a mobile phone. Of course, the embodiments of the present disclosure include but are not limited thereto, and the display apparatus may be a tablet personal computer, a laptop, a television, a digital photo frame, and other electronic device having a display function.

There are some points to be illustrated:

(1) Unless otherwise defined, in the embodiments of the present disclosure and the accompanying drawings, a same reference sign denotes a same meaning.

(2) Drawings of the embodiments of the present disclosure only refer to structures related to the embodiments of the present disclosure, and other structures may refer to general design.

(3) In order to make it clear, in the drawings for illustrating the embodiments of the present disclosure, a thickness of a layer or a region is magnified. It should be understood that, when elements such as a layer, a film, a region or a substrate and the like are called to be "above" or "below" another element, the element may be directly located "on" or "beneath" the other element, or there may be an intermediate element.

(4) In case of no conflict, features in the same embodiment and different embodiments of the present disclosure may be combined with each other.

The above are only specific embodiments of the present disclosure, but the scope of the present disclosure is not limited thereto, and any skilled in the art, within the technical scope disclosed by the present disclosure, can easily think of variations or replacements, which should be covered within the protection scope of the present disclosure. Therefore, the scope of the present disclosure should be the scope of the following claims.

The invention claimed is:

1. A foldable display screen, comprising:
a display panel;
a touch sensing panel, located on a side of the display panel;
a first optical adhesive layer, located on a side of the touch sensing panel away from the display panel; and
a second optical adhesive layer, located between the display panel and the touch sensing panel,
at a working temperature, an elastic modulus of the first optical adhesive layer and an elastic modulus of the second optical adhesive layer are both less than 1 MPa,
wherein the thickness of the second optical adhesive layer is 1.5 to 3.5 times the thickness of the first optical adhesive layer, and the thickness of the first optical adhesive layer is 40 μm to 60 μm, and the thickness of the second optical adhesive layer is 50 μm to 145 μm, the working temperature comprises at least one of a first temperature, a second temperature, and a third temperature, the first temperature is less than the second temperature, the first temperature is greater than the third temperature, an elastic modulus of the first optical adhesive layer at the first temperature is greater than an elastic modulus of the first optical adhesive layer at the second temperature and less than an elastic modulus of the first optical adhesive layer at the third temperature, and an elastic modulus of the second optical adhesive layer at the first temperature is greater than an elastic modulus of the second optical adhesive layer at the second temperature and less than an elastic modulus of the second optical adhesive layer at the third temperature.

2. The foldable display screen according to claim 1, wherein, at the working temperature, the elastic modulus of the first optical adhesive layer and the elastic modulus of the second optical adhesive layer are both greater than 10 kPa.

3. The foldable display screen according to claim 1, wherein, at the working temperature, the elastic modulus of the first optical adhesive layer and the elastic modulus of the second optical adhesive layer are both less than 200 kPa.

4. The foldable display screen according to claim 1, wherein, the working temperature is a temperature in a range of −30° C. to 60° C.

5. The foldable display screen according to claim 1, wherein, the elastic modulus of the first optical adhesive layer is greater than or equal to the elastic modulus of the second optical adhesive layer, and the thickness of the first optical adhesive layer is less than or equal to the thickness of the second optical adhesive layer.

6. The foldable display screen according to claim 1, further comprising a base film and an anti-reflection layer; wherein, the base film is located on a side of the display panel away from the second optical adhesive layer; and the anti-reflection layer is located between the display panel and the second optical adhesive layer.

7. The foldable display screen according to claim 6, wherein, the anti-reflection layer includes a polarizer sheet.

8. The foldable display screen according to claim 1, further comprising a cover layer; wherein, the cover layer is located on a side of the first optical adhesive layer away from the touch sensing panel.

9. The foldable display screen according to claim 1, wherein, the foldable display screen has a first neutral layer and a second neutral layer,
the first neutral layer is located in the display panel; and
the second neutral layer is located in the touch sensing panel.

10. The foldable display screen according to claim 9, wherein, the display panel comprises a first base substrate, and a light-emitting device layer and an encapsulation layer located on a side of the first base substrate closer to the second optical adhesive layer; the encapsulation layer is configured to encapsulate a light-emitting device in the light-emitting device layer; and the first neutral layer includes the encapsulation layer.

11. The foldable display screen according to claim 9, wherein, the touch sensing panel includes a second base substrate and a touch structure located on the second base substrate; and the second neutral layer includes the touch structure.

12. The foldable display screen according to claim 1, wherein, the foldable display screen comprises a bendable region and a non-bendable region;
wherein, the bendable region is configured to be bendable around a rotating shaft extending along a first direction; the non-bendable region is located on at least one side of the bendable region in a second direction; and the second direction is perpendicular to the first direction.

13. A display apparatus, comprising the foldable display screen according to claim 1.

14. The foldable display screen according to claim 1, wherein the first temperature comprises 20° C., the second temperature comprises 60° C., and the third temperature comprises −30° C.

15. The foldable display screen according to claim 1, wherein the elastic modulus of the first optical adhesive layer at the first temperature and the elastic modulus of the second optical adhesive layer at the first temperature are both 30 kPa to 50 kPa, the elastic modulus of the first optical adhesive layer at the second temperature and the elastic modulus of the second optical adhesive layer at the second temperature are both 10 kPa to 30 kPa, and the elastic modulus of the first optical adhesive layer at the third temperature and the elastic modulus of the second optical adhesive layer at the third temperature are both 90 kPa to 110 kPa.

16. A foldable display screen, comprising
a display panel;
a touch sensing panel, located on one side of the display panel;
a first optical adhesive layer, located on a side of the touch sensing panel away from the display panel; and
a second optical adhesive layer, located between the display panel and the touch sensing panel,
wherein, at a working temperature, a ratio of an elastic modulus of the first optical adhesive layer to a thickness of the first optical adhesive layer is a first ratio; a ratio of an elastic modulus of the second optical adhesive layer to a thickness of the second optical adhesive layer is a second ratio; and both the first ratio and the second ratio are less than 1/20 MPa/μm, wherein the thickness of the second optical adhesive layer is 1.5 to 3.5 times the thickness of the first optical adhesive layer, and the thickness of the first optical adhesive layer is 40 μm to 60 μm, and the thickness of the second optical adhesive layer is 50 μm to 145 μm, the working temperature comprises at least one of a first temperature, a second temperature, and a third temperature, the first temperature is less than the second temperature, the first temperature is greater than the third temperature, an elastic modulus of the first optical adhesive layer at the first temperature is greater than an elastic modulus of the first optical adhesive layer at the second temperature and less than an elastic modulus of the first optical adhesive layer at the third temperature, and an elastic modulus of the second optical adhesive layer at the first temperature is greater than an elastic modulus of the second optical adhesive layer at the second temperature and less than an elastic modulus of the second optical adhesive layer at the third temperature.

17. The foldable display screen according to claim 16, wherein, the first ratio and the second ratio are positively correlated.

18. The foldable display screen according to claim 16, wherein, the first ratio is greater than the second ratio.

19. The foldable display screen according to claim 16, wherein, the first ratio and the second ratio are both greater than 0.01/200 MPa/μm.

\* \* \* \* \*